(12) United States Patent
Li et al.

(10) Patent No.: US 10,856,418 B2
(45) Date of Patent: Dec. 1, 2020

(54) POWER SUPPLY FOR A CAMERA

(71) Applicant: TRIPLE WIN TECHNOLOGY(SHENZHEN) CO.LTD., Shenzhen (CN)

(72) Inventors: Kun Li, Shenzhen (CN); Shin-Wen Chen, New Taipei (TW); Yu-Shuai Li, Shenzhen (CN); Long-Fei Zhang, Guangdong (CN)

(73) Assignee: TRIPLE WIN TECHNOLOGY (SHENZHEN) CO.LTD., Shenzhen (CN)

( * ) Notice: Subject to any disclaimer, the term of this patent is extended or adjusted under 35 U.S.C. 154(b) by 93 days.

(21) Appl. No.: 16/182,567

(22) Filed: Nov. 6, 2018

(65) Prior Publication Data
US 2020/0077517 A1     Mar. 5, 2020

(30) Foreign Application Priority Data
Aug. 31, 2018   (CN) .......................... 2018 1 1014143

(51) Int. Cl.
| | |
|---|---|
| *H04N 5/225* | (2006.01) |
| *H05K 1/14* | (2006.01) |
| *G02B 7/02* | (2006.01) |
| *G02B 5/20* | (2006.01) |
| *G03B 11/00* | (2006.01) |

(Continued)

(52) U.S. Cl.
CPC ............. *H05K 1/144* (2013.01); *G02B 5/208* (2013.01); *G02B 7/02* (2013.01); *G03B 11/00* (2013.01); *H04N 5/2253* (2013.01); *H04N 5/2254* (2013.01); *H05K 1/028* (2013.01); *H05K 1/0306* (2013.01); *H05K 1/181* (2013.01);

(Continued)

(58) Field of Classification Search
CPC .... H04N 5/2253; H04N 5/2254; G02B 5/208; H05K 1/144; H05K 1/028; H05K 2201/10121; H05K 2201/10151
USPC ......................................................... 348/374
See application file for complete search history.

(56) References Cited

U.S. PATENT DOCUMENTS

| | | | | |
|---|---|---|---|---|
| 2007/0252703 A1* | 11/2007 | Kato | ................ | G06K 19/07771 340/572.8 |
| 2010/0170082 A1* | 7/2010 | Lo | ........................ | H04N 5/2254 29/593 |

(Continued)

FOREIGN PATENT DOCUMENTS

| | | |
|---|---|---|
| CN | 105100569 | 11/2015 |
| CN | 108363159 A | 8/2018 |

*Primary Examiner* — Usman A Khan
(74) *Attorney, Agent, or Firm* — ScienBiziP, P.C.

(57) ABSTRACT

A camera includes a circuit board, an image sensing chip, a package base, a lens module, a flexible circuit board, and a first carrier plate. The circuit board includes a first surface and an opposite second surface. The circuit board defines a window through the first surface and the second surface. The image sensing chip is mounted to the second surface and includes a photosensitive area viewable through the window. The package base is mounted to the first surface and defines a light hole. The lens module is mounted to the package base. The first carrier plate is mounted to the second surface and covers the image sensing chip. The circuit board further includes an end portion not covered by the first carrier plate. The flexible circuit board is mounted to the second surface of the end portion and is electrically coupled to the image sensing chip.

12 Claims, 5 Drawing Sheets

(51) Int. Cl.
*H05K 1/03* (2006.01)
*H05K 1/18* (2006.01)
*H05K 1/02* (2006.01)

(52) U.S. Cl.
CPC .............. *H05K 2201/10121* (2013.01); *H05K 2201/10151* (2013.01); *H05K 2201/10674* (2013.01)

(56) References Cited

U.S. PATENT DOCUMENTS

| | | | |
|---|---|---|---|
| 2014/0001496 A1* | 1/2014 | Musser | F21V 29/71 257/88 |
| 2018/0048796 A1 | 2/2018 | Hsu et al. | |

* cited by examiner

POWER SUPPLY FOR A CAMERA

FIELD

The subject matter herein generally relates to cameras, and more particularly to a power supply for an electronic device.

BACKGROUND

Electronic devices, such as mobile phones, generally include a camera. The camera is made of a plurality of components generally stacked together. As electronic devices trend toward thinner sizes, the camera having a slimmer size is required.

BRIEF DESCRIPTION OF THE DRAWINGS

Implementations of the present disclosure will now be described, by way of example only, with reference to the attached figures.

DETAILED DESCRIPTION

Figure 1:
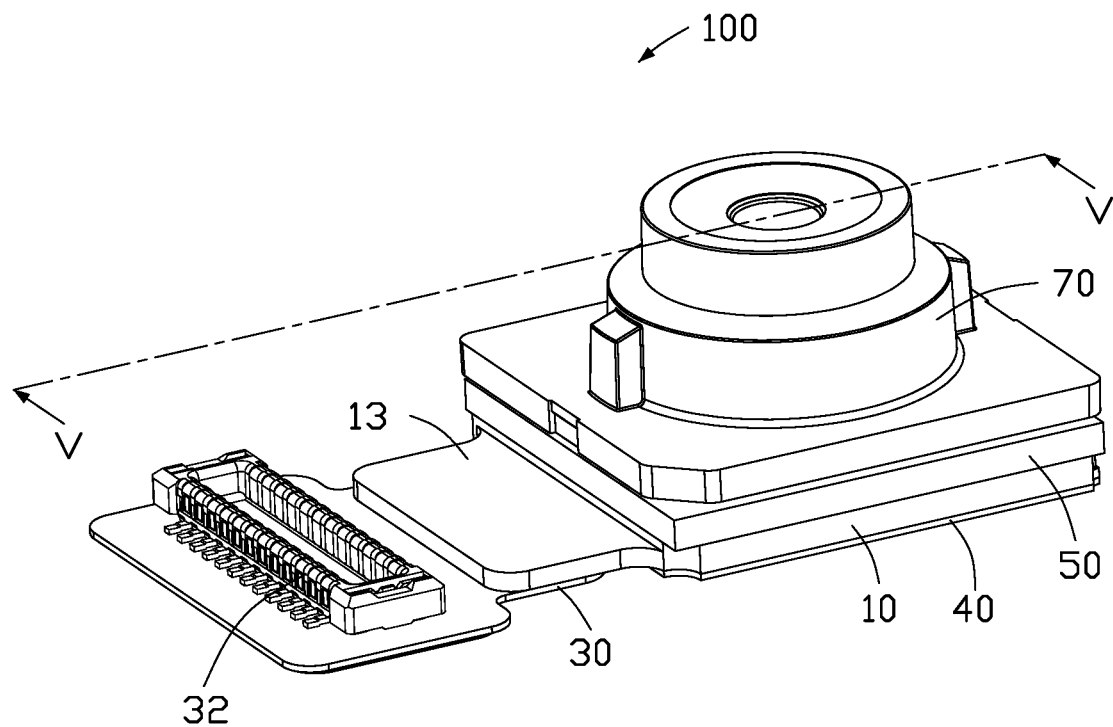
FIG. 1 is an assembled, isometric view of an embodiment of a camera.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

Figure 2:
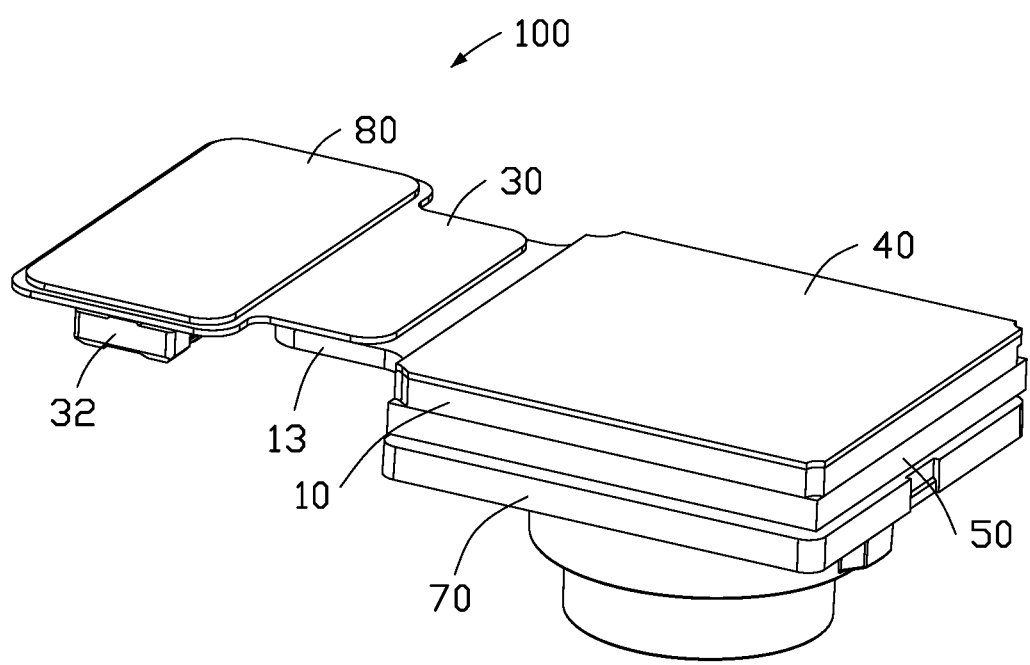
FIG. 2 is similar to FIG. 1, but shows the camera from another angle.
Figure 3:
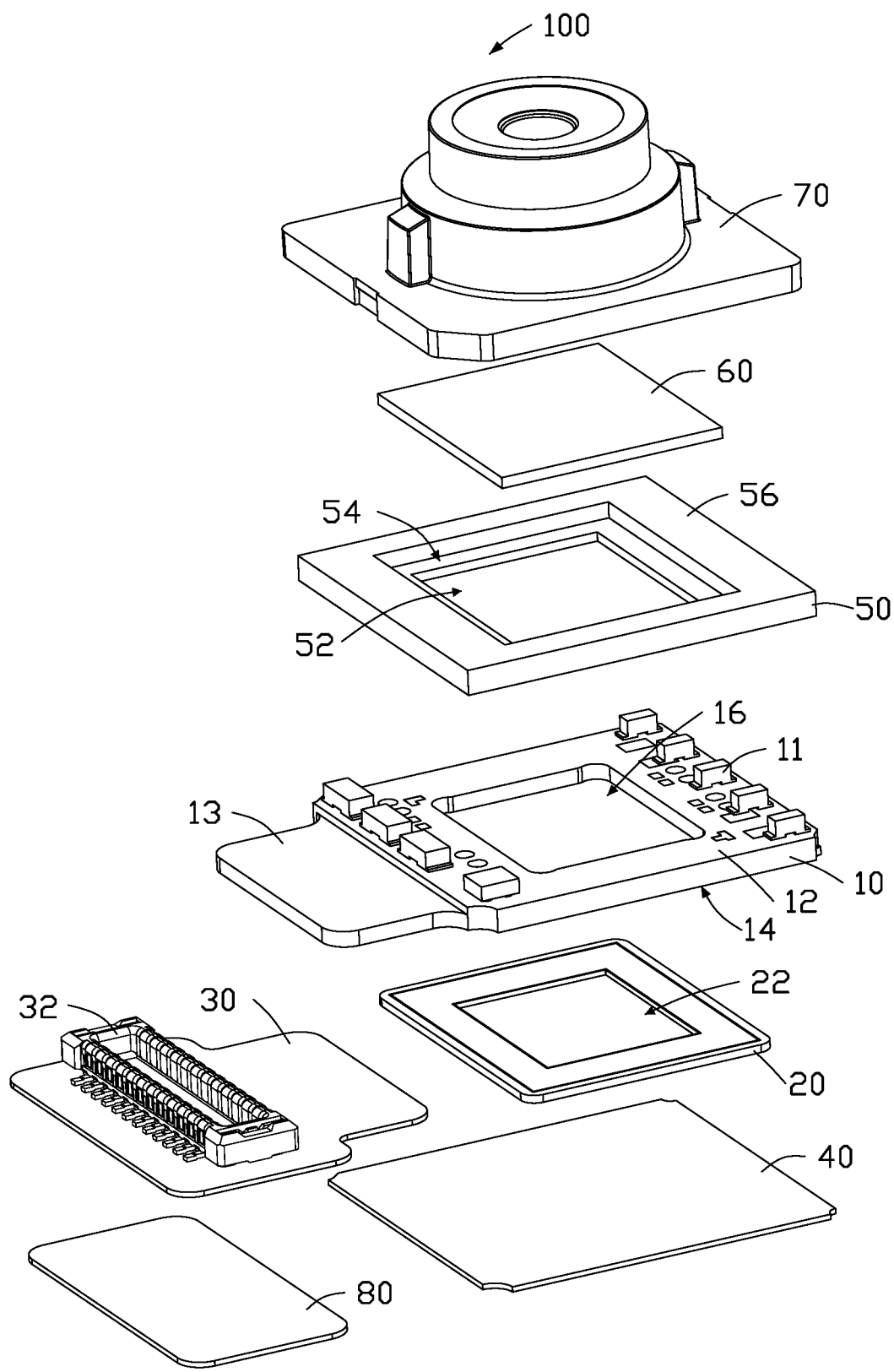
FIG. 3 is an exploded view of the camera in FIG. 1.
Figure 4:
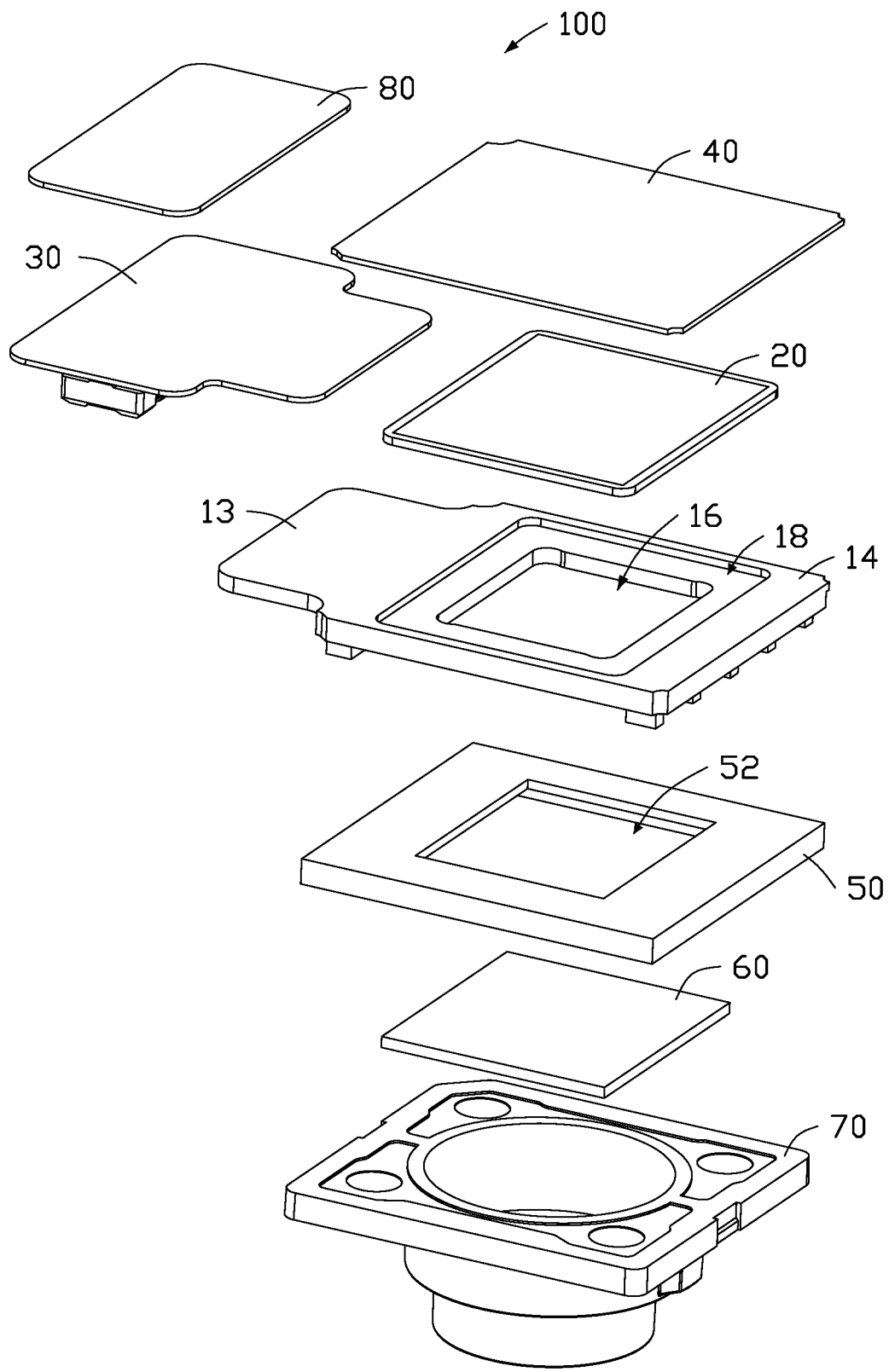
FIG. 4 is an exploded view of the camera in FIG. 2.
Figure 5:
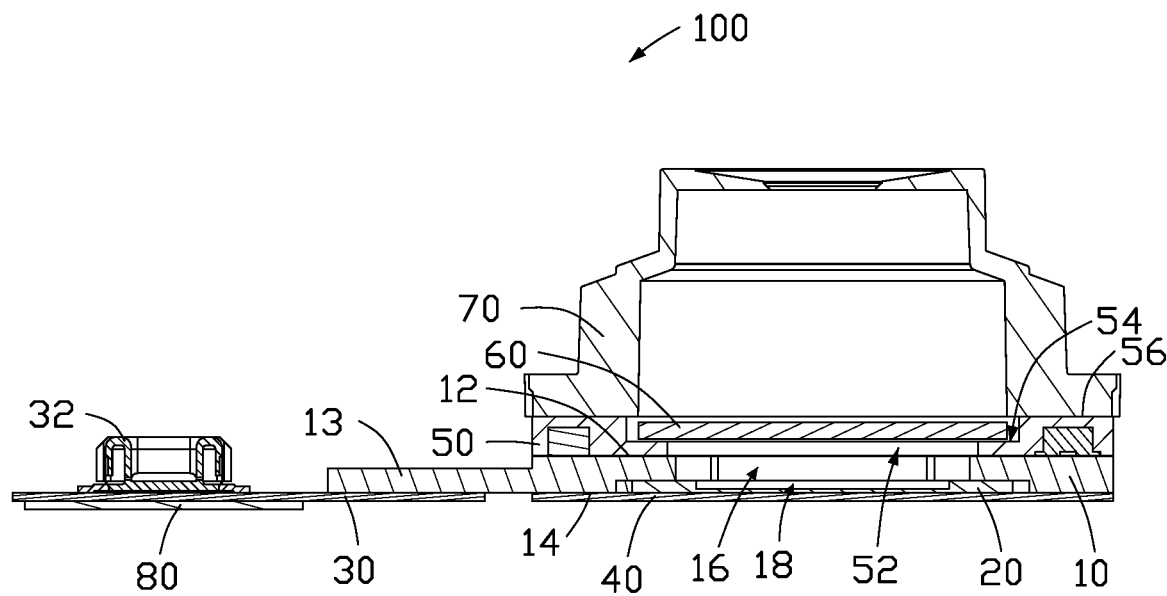
FIG. 5 is a cross-sectional view of the camera in FIG. 1 taken along line V-V. please label "first carrier plate 40" to show 30 and 40 are arranged side by side).

FIGS. 1-5 show an embodiment of a camera 100. The camera 100 includes a circuit board 10, an image sensing chip 20, a flexible circuit board 30, a first carrier plate 40, a package base 50, a protecting cover 60, a lens module 70, and a second carrier plate 80.

The circuit board 10 may be made of ceramic or other hard material. The circuit board 10 includes a first surface 12 and a second surface 14. The second surface 14 is opposite to the first surface 12. The circuit board 10 defines a window 16 through the first surface 12 and the second surface 14. The circuit board 10 further defines a mounting groove 18. The mounting groove 18 is defined in the second surface 14 and is in communication with the second surface 14. A size of the mounting groove 18 is greater than a size of the window 16. The first surface 12 includes a plurality of circuit components 11 mounted around a periphery of the window 16. The circuit components 11 may be, but are not limited to, resistors, capacitors, diodes, triodes, potentiometers, relays, drivers, or the like.

The image sensing chip 20 is flip-chip mounted and received within the mounting groove 18. The image sensing chip 20 is electrically coupled to the circuit components 11 to sense signals. The image sensing chip 20 includes a photosensitive area 22 facing the window 16. The photosensitive area 22 is viewable through the window 16 and is capable of sensing light.

The first carrier plate 40 is mounted to the second surface 14 and covers over the mounting groove 18 to seal the image sensing chip 20 to the side of the first carrier plate 40 facing the circuit board 10. The first carrier plate 40 protects the image sensing chip 20 and prevents the image sensing chip 20 from falling out of the mounting groove 18. The first carrier plate 40 is made of metal. The first carrier plate 40 is integrally formed with the circuit board 10 by a molding on board method.

The circuit board 10 includes an end portion 13. The end portion 13 is not covered by the first carrier plate 40. The flexible circuit board 30 is mounted to the second surface 14 of the end portion 13. The flexible circuit board 30 is electrically coupled to the image sensing chip 20 to provide signal transmission therebetween. The flexible circuit board 30 may be mounted to the end portion 13 by an adhesive, for example. The flexible circuit board 30 is electrically coupled to a connector 32. The connector 32 provides signal transmission between the circuit board 10 and an external component.

The second carrier plate 80 is mounted to a side of the flexible circuit board 30 facing away from the circuit board 10 and is adapted for protecting the flexible circuit board 30. The second carrier plate 80 may be adhered to the flexible circuit board 30 by an adhesive, for example. The second carrier plate 80 is made of metal.

The package base 50 is mounted to the second surface 12 of the circuit board 10. In one embodiment, the package base 50 is integrally formed with the circuit board 10 by a molding on board method. The package base 50 further covers over the plurality of circuit components 11. The package base 50 defines a light hole 52 and a recessed area 54. The recessed area 54 surrounds the light hold 52. The light hole 52 is located along a light path of the image sensing chip 20.

The package base 50 is made of non-transparent material capable of absorbing light scattered by lens elements of the lens module 70. The package base 50 may be formed by injection molding, mold pressing, or the like. Material of the package base 50 may be selected from, but is not limited to, liquid crystal polymer and polypropylene. The mold pressing method may be carried out using resin. The package base 50 covers over the circuit components 11, so that the circuit components 11 are not directly exposed to air, thereby preventing erosion of the circuit components 11 within the photosensitive area 22.

The package base 50 further includes a loading surface 56 facing away from the circuit board 10. The protecting cover 60 is mounted within the recessed area 54, and a surface of the protecting cover 60 facing away from the circuit board 10 when mounted in the recessed area 54 is not higher than the loading surface 56. The protecting cover 60 is formed by a molding on board method. The lens module 70 is mounted to the loading surface 56 and aligned with the image sensing chip 20. Light passing through the lens module 70 is first passed through the protecting cover 60, and then received by the image sensing chip 20.

In one embodiment, the protecting cover 60 is made of glass. In other embodiments, the protecting cover is made of resin. The protecting cover 60 may be an infrared filter to improve an image quality of the lens module 70. In other embodiments, the protecting cover 60 is a transparent cover. The protecting cover 60, the package base 50, the circuit board 10, and the first carrier plate 40 cooperatively protect the image sensing chip 20. Thus, the photosensitive area 22 is protected from dust and debris.

The lens module 70 may be a fixed-focus lens module or a variable-focus lens module.

The flexible circuit board 30 and the first carrier plate 40 are both mounted to the second surface 14 in a side-by-side relationship, thereby decreasing a thickness of the camera 100.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A camera comprising:
    a circuit board comprising a first surface and a second surface opposite to the first surface, the circuit board defining a window through the first surface and the second surface;
    an image sensing chip mounted to the second surface of the circuit board and comprising a photosensitive area exposed through the window;
    a package base mounted to the first surface of the circuit board and defining a light hole along a light path of the image sensing chip;
    a lens module mounted to the package base;
    a flexible circuit board;
    a first carrier plate mounted to the second surface of the circuit board and covering the image sensing chip; wherein:
    the circuit board further comprises an end portion not covered by the first carrier plate; and
    the flexible circuit board is mounted to the second surface of the end portion and is electrically coupled to the image sensing chip, the flexible circuit board and the first carrier are arranged side by side on the second surface of the circuit board.

2. The camera of claim 1, wherein:
    a plurality of circuit components are mounted on the first surface around a periphery of the window; and
    the package base is mounted over the plurality of circuit components.

3. The camera of claim 2, wherein the package base is integrally formed with the circuit board by a molding on board method.

4. The camera of claim 2, wherein:
    the circuit board defines a mounting groove in the second surface;
    a size of the mounting groove is greater than a size of the window;
    the mounting groove is in communication with the window;
    the image sensing chip is flip-chip mounted within the mounting groove; and
    a back side opposite to the photosensitive area of the image sensing chip is coplanar with the second surface.

5. The camera of claim 4, wherein a side of the flexible circuit board adjacent to the circuit board is electrically coupled to a connector.

6. The camera of claim 1, further comprising a second carrier plate mounted on a surface of the flexible circuit board facing away from the circuit board.

7. The camera of claim 1, further comprising a protecting cover, wherein:
    the package base comprises a loading surface facing away from the circuit board;
    the package base defines a recessed area around the light hole;
    the protecting cover is received within the recessed area; and
    a surface of the protecting cover facing away from the circuit board when the protective cover is received in the recessed area is not higher than the loading surface.

8. The camera of claim 7, wherein the lens module is mounted to the loading surface and aligned with the image sensing chip.

9. The camera of claim 7, wherein the protecting cover is an infrared filter.

10. The camera of claim 1, wherein the first carrier plate is made of metal.

11. The camera of claim 2, wherein the circuit board is made of ceramic.

12. The camera of claim 1, wherein the flexible circuit board and the first carrier plate are arranged side-by-side and each of the flexible circuit board and the first carrier plate is mounted to the second side of the circuit board.

* * * * *